US012402265B2

(12) United States Patent
Chien

(10) Patent No.: US 12,402,265 B2
(45) Date of Patent: Aug. 26, 2025

(54) CHASSIS TOP COVER SUPPORT INTEGRATED RISER CAGE ASSEMBLY

(71) Applicant: DELL PRODUCTS L.P., Round Rock, TX (US)

(72) Inventor: Tung Yu Chien, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 265 days.

(21) Appl. No.: 18/316,135

(22) Filed: May 11, 2023

(65) Prior Publication Data

US 2024/0381556 A1 Nov. 14, 2024

(51) Int. Cl.
*H05K 5/03* (2006.01)
*H05K 5/02* (2006.01)
*H05K 7/14* (2006.01)

(52) U.S. Cl.
CPC ............ *H05K 5/03* (2013.01); *H05K 5/0221* (2013.01); *H05K 5/0286* (2013.01); *H05K 7/1424* (2013.01)

(58) Field of Classification Search
None
See application file for complete search history.

(56) References Cited

U.S. PATENT DOCUMENTS

| | | | | |
|---|---|---|---|---|
| 6,118,668 A | * | 9/2000 | Scholder | G06F 1/184 |
| | | | | 361/801 |
| 7,742,291 B2 | * | 6/2010 | Wu | G06F 1/185 |
| | | | | 361/679.32 |
| 8,472,210 B2 | * | 6/2013 | Chiu | G06F 1/186 |
| | | | | 361/752 |
| 10,433,451 B1 | * | 10/2019 | Wang | H05K 7/1417 |
| 11,369,033 B1 | * | 6/2022 | Tsorng | H05K 7/1487 |
| 11,439,033 B2 | * | 9/2022 | Mao | H05K 7/1457 |
| 2011/0051339 A1 | | 3/2011 | Wang et al. | |
| 2014/0340834 A1 | * | 11/2014 | Lee | G06F 1/185 |
| | | | | 29/829 |
| 2016/0224497 A1 | | 8/2016 | Hartman et al. | |
| 2017/0185111 A1 | | 6/2017 | Yu et al. | |
| 2022/0006238 A1 | * | 1/2022 | Mithani | H01R 13/506 |
| 2022/0026965 A1 | * | 1/2022 | Chen | H05K 7/20145 |
| 2022/0057848 A1 | * | 2/2022 | Chang | H05K 5/0265 |
| 2022/0272859 A1 | * | 8/2022 | Zhang | H05K 1/141 |
| 2023/0225070 A1 | * | 7/2023 | Hung | H05K 7/1429 |
| | | | | 361/679.32 |
| 2023/0344159 A1 | * | 10/2023 | Hsu | H01R 12/737 |
| 2024/0164043 A1 | * | 5/2024 | Tsorng | G06F 1/185 |

* cited by examiner

*Primary Examiner* — Xanthia C Relford
(74) *Attorney, Agent, or Firm* — Larson Newman, LLP

(57) ABSTRACT

An information handling system includes a connection tab physically coupled to a top cover of the information handling system, and a sliding bracket configured to engage with a riser cage of the information handling system and the connection tab of the top cover. A mezzanine card holder has an alignment sleeve through which a standoff of a system board of the information handling system may be inserted, such that the standoff may engage with the sliding bracket.

20 Claims, 8 Drawing Sheets

CHASSIS TOP COVER SUPPORT INTEGRATED RISER CAGE ASSEMBLY

FIELD OF THE DISCLOSURE

The present disclosure generally relates to information handling systems, and more particularly relates to a chassis top cover support integrated riser cage assembly.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a connection tab physically coupled to a top cover of the information handling system, and a sliding bracket configured to engage with a riser cage of the information handling system and the connection tab of the top cover. A mezzanine card holder has an alignment sleeve through which a standoff of a system board of the information handling system may be inserted, such that the standoff may engage with the sliding bracket.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
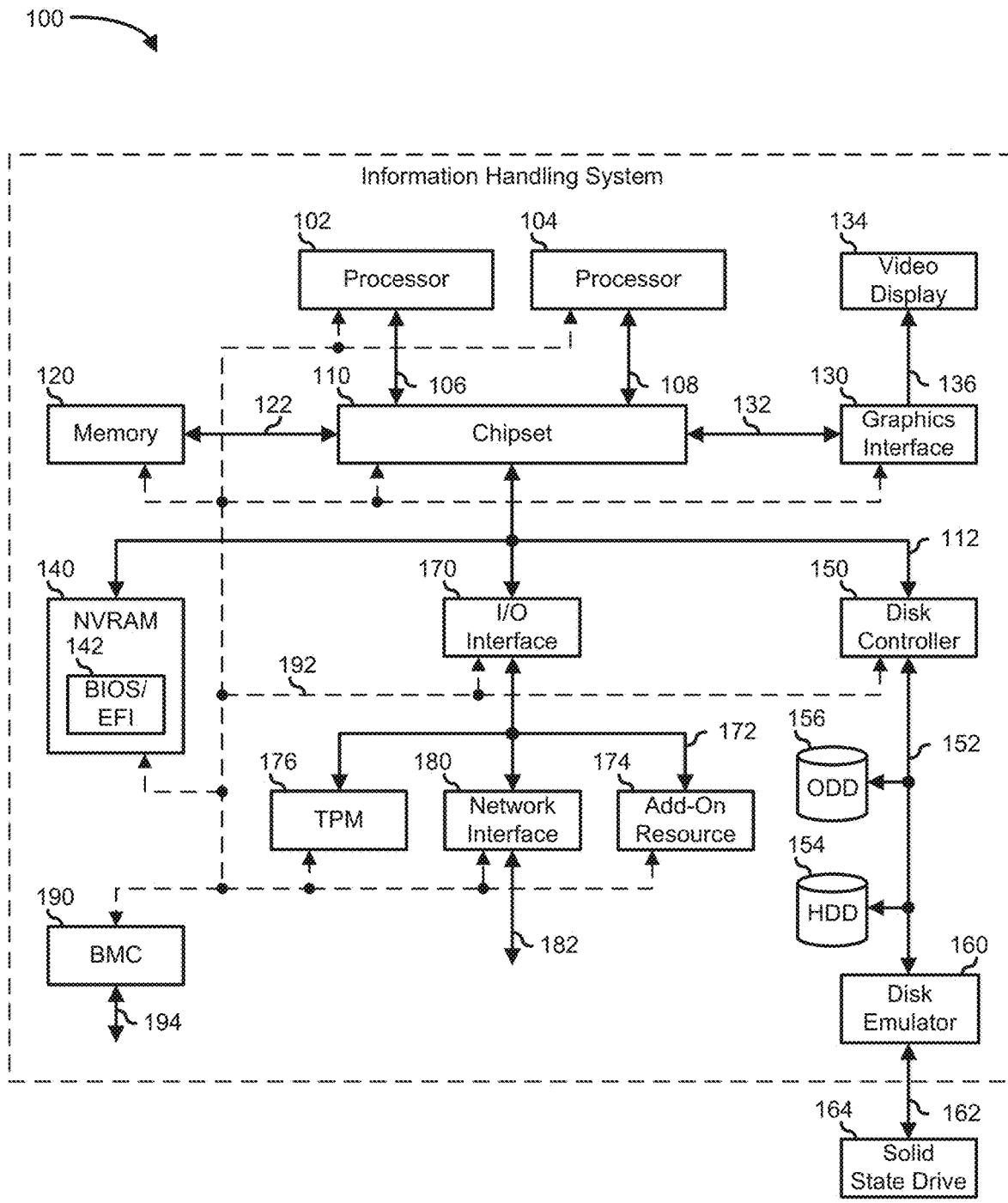
FIG. 1 is a block diagram illustrating an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a double data rate (DDR) memory channel and memory 120 represents one or more DDR dual in-line memory modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as dynamic random access memory (DRAM) DIMMs, static random access memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132 and provides a video display output 136 to a video display 134. An example of a graphics interface 132 includes a PCIe interface and graphics adapter 130 can include a four-lane (×4) PCIe adapter, an eight-lane (×8) PCIe adapter, a 16-lane (×16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 1870. Chipset 110 can also include one or more other I/O interfaces, including a PCIe interface, an Industry Standard Architecture (ISA) interface, a Small Computer Serial Interface (SCSI) interface, an Inter-Integrated Circuit (I2C) interface, a Serial Peripheral Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board, or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172, and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 1882 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device, a BMC may be referred to as an embedded controller (EC). A BMC included in a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell R Remote Access Controller (iDRAC).

Management interface 192 represents one or more out-of-band communication interfaces between BMC 190 and the elements of information handling system 100, and can include a I2C bus, a System Management Bus (SMBus), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a RedfishR interface), various vendor defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC, or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purposes of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

An information handling system such as a rackmount server, with a size of two rack units, is typically designed with a long-span top cover with minimal if any support. This is because typically there is no space to add a support feature, also referred to simply as a support, for the top cover that is integrated with a chassis of the information handling system because the information handling system is usually fully occupied by various components, such as a motherboard, riser cages, Peripheral Component Interconnect-Express (PCIe) cards, etc. An issue arises when using a vacuum hoist lift to transport the information handling system. Because the vacuum hoist lift typically grips and lifts the information handling system via its top cover, the weight of the information handling system is held by the top cover. Because of its long span, when there is inadequate support for the top cover, the top cover may be deformed during transport. As the weight of the information handling system increases, the chance that the top cover deforms also increases. This may result in additional issues. For example, sliding the information handling system into a rack chassis may be difficult due to limited margins allotted for each slot. Thus, there is a need for a support for the top cover with a better structure integration within the chassis of the information handling system. This allows transporting the information handling system using the top cover, such as by the vacuum hoist lift, without the risk of deforming the top cover.

Figure 2:
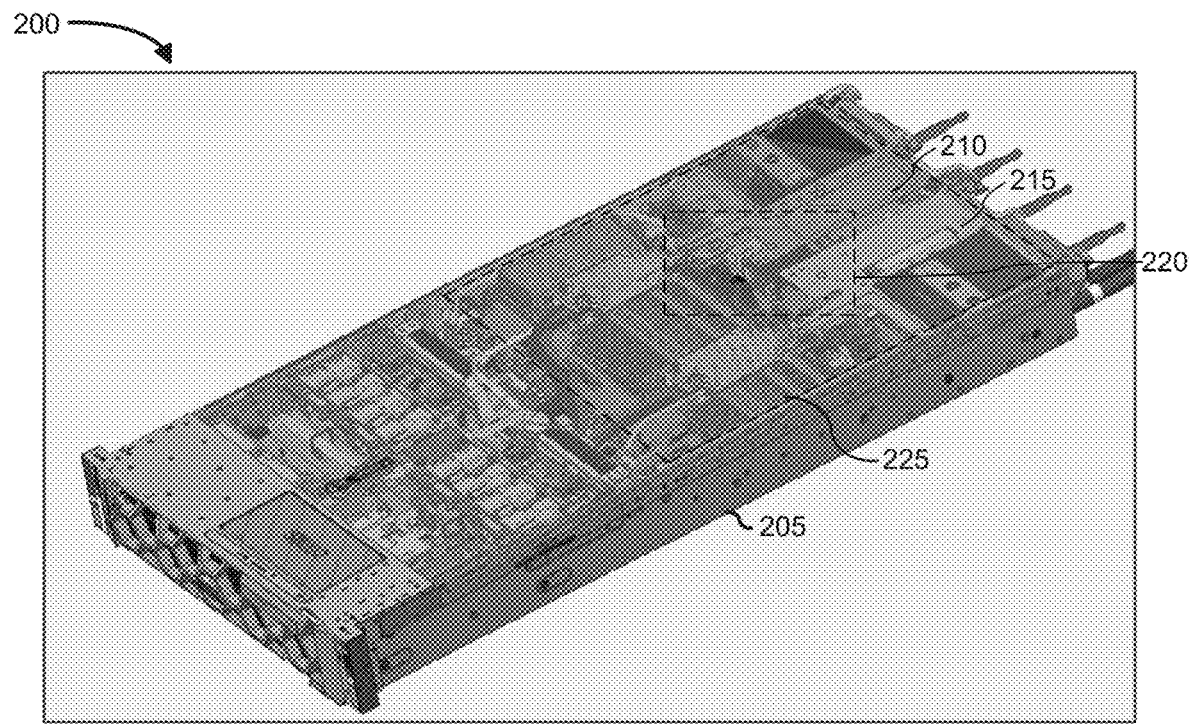
FIG. 2 is a perspective view of an information handling system according to an embodiment of the present disclosure.

FIG. 2 shows a perspective view of an information handling system 200. Information handling system 200, which is similar to information handling system 100 of FIG. 1, maybe a rackmount server that includes a chassis 205 and riser cages 210 and 215. Information handling system 200 also includes a system board 225, also referred to herein as a motherboard, a portion of which is disposed underneath riser cages 210 and 215. Information handling system 200 is shown with a top cover for chassis 205 in transparent view to highlight features of embodiments of the present disclosure.

In this example, the present disclosure includes a top cover support assembly with re-designed top cover, riser cage, and mezzanine card holder components. The top cover support also includes a sliding bracket to engage with the top cover, riser cage, and mezzanine card holder, securing the top cover and motherboard support tray as one solid assembly part. For example, the top cover includes a connection tab feature, also referred to simply as a connection tab, which may be configured to engage with a connection slot of the riser cage, also referred to herein as a riser cage slot or simply as a slot. The connection slot may also be configured to be aligned with another connection slot of a sliding bracket.

The sliding bracket may also be configured with a U-shaped notch or channel that is aligned with a similar U-shaped notch or channel of the connection tab and an alignment sleeve of the mezzanine card holder. The alignment sleeve of the mezzanine cardholder may be configured through which a standoff of support tray of a system board, also referred to as a motherboard, of the information handling system, may be inserted. The support tray of the system board may be physically coupled to the information handling system's chassis. Thus, providing support for the top cover of information handling system 200. One of ordinary skill in the art will appreciate that an information handling device in accordance with embodiments of the present disclosure may include additional components than those illustrated in the figures.

Information handling system 200 may be any size that is configured to fit within a chassis, enclosure, or server rack. For example, information handling system 200 may be of any size, including, but not limited to, a one rack unit of height rackmount server or a two rack unit rackmount server, etc. Moreover, information handling system 200 may represent a full-width rackmount server, a half-width rackmount server, or any other width rackmount server. Information handling system 100 includes a section 220 which is shown in greater detail in FIG. 2.

Riser cages 210 and 215, also referred to herein simply as risers, may be used to extend a slot for a chip or card in a fully loaded information handling system. For example, riser cages 210 and 215 may secure Peripheral Component Interconnect (PCI) cards, PCIe cards, mezzanine cards, or the like. Further, riser cages 210 and 215 may be butterfly riser cages. In one embodiment, riser cages 210 and 215 may latch to a chassis of information handling system 200. One of ordinary skill in the art will appreciate that riser cages 210 and 215 may be of varying length and width and may retain PCI, PCIe, and/or mezzanine cards of varying length and/or width. Each of riser cages 210 and 215 includes features discussed in greater detail below. For example, although the illustrations refer to riser cage 210, riser cage 215 may include a mezzanine card holder and a sliding bracket configured to provide top cover support that is integrated into the chassis of information handling system 200.

Figure 3:
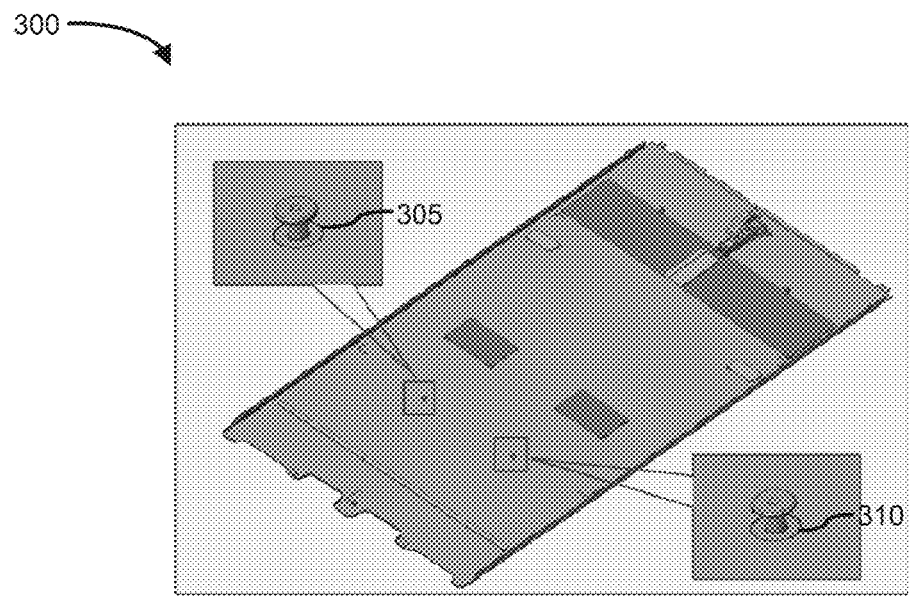
FIG. 3 is a perspective view of a top cover of an information handling system, according to an embodiment of the present disclosure.

FIG. 3 shows a top cover 300 of information handling system 200 of FIG. 2. Top cover 300 includes connection tabs 305 and 310. Connection tabs 305 and 310 may be t-connection tabs, such that each connection tab may engage with a connection slot of a riser cage. For example, connection tab 305 may be configured to engage with a connection slot of riser cage 210 and its support. Connection tab 310 may be configured to engage with a connection slot of riser cage 215 and its support. Top cover 300 may be pivotally, slidably, or otherwise removably attached to information handling system 200 of FIG. 2. Connection tabs 305 and 310 may be of suitable material which may be similar to the material used for top cover 300.

Figure 4:
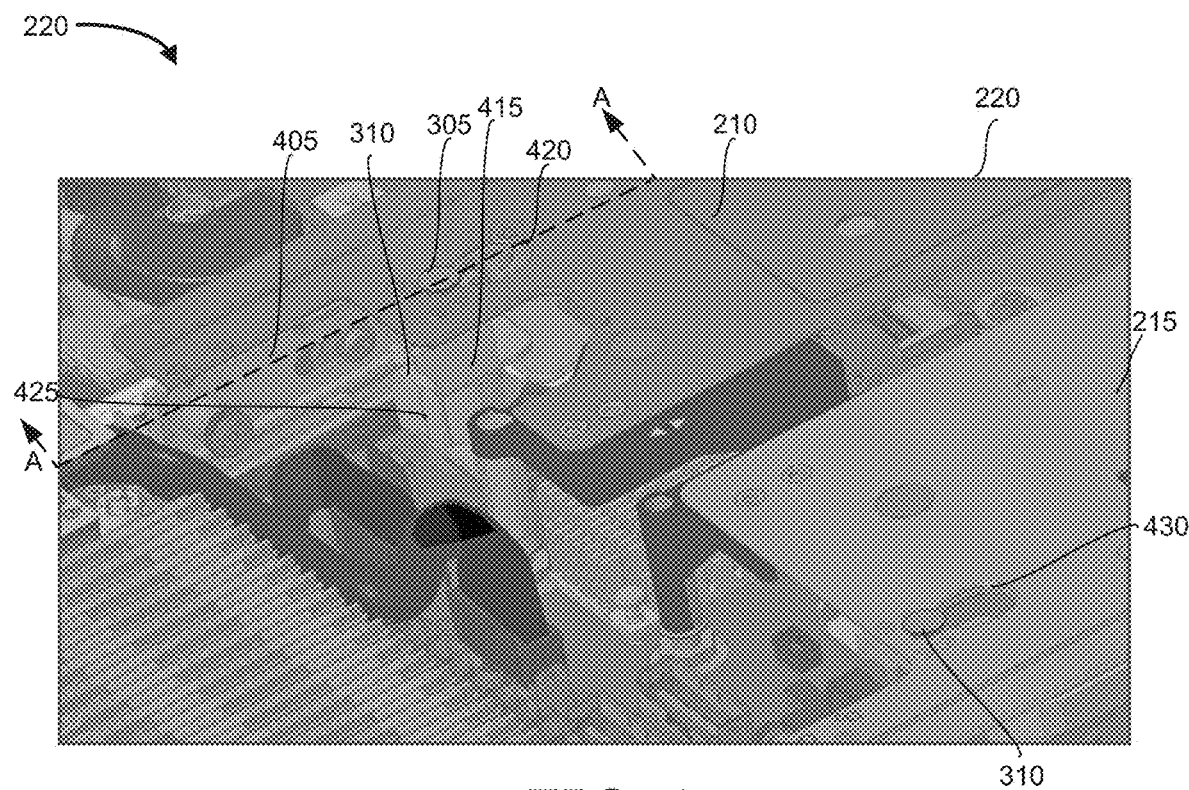
FIG. 4 is a perspective view of a section of an information handling system, according to an embodiment of the present disclosure.

FIG. 4 shows an expanded view of section 220 of information handling system 200 of FIG. 2 in greater detail. The expanded view is shown with a top cover of information handling system 200 set to transparent except for connection tabs 305 and 310. This is performed to highlight features of embodiments of the present disclosure. Section 220 shows a connection slot 420 of riser cage 210. Connection slot 420 may be configured to align with a connection tab of a sliding bracket 405 as shown in greater detail below. The connection slots may be used to physically couple riser cage 210 and sliding bracket 405 to a connection tab of a top cover of information handling system 200. Accordingly, riser cage 215 includes a connection slot 430 that may be configured to align with a connection slot of sliding bracket 405.

The connection slots may be used to physically couple riser cage 215 and sliding bracket 405 to a connection tab of the top cover of information handling system 200. For example, connection tab 305 may be configured to physically couple with an undercut or U-shaped notch of connection slot 420. Similarly, connection tab 310 may be configured to physically couple with an undercut or U-shaped notch of connection slot 420. The expanded view also shows a mezzanine card holder 410 with an alignment sleeve 425. Alignment sleeve 425 may be used to physically couple mezzanine card holder 410 with a standoff of a system board of information handling system 200 as shown in greater detail below. Sliding bracket 405 and its components along with mezzanine card holder 410 may be of suitable material, such as a non-ferromagnetic material like hard plastic or similar.

Figure 5:
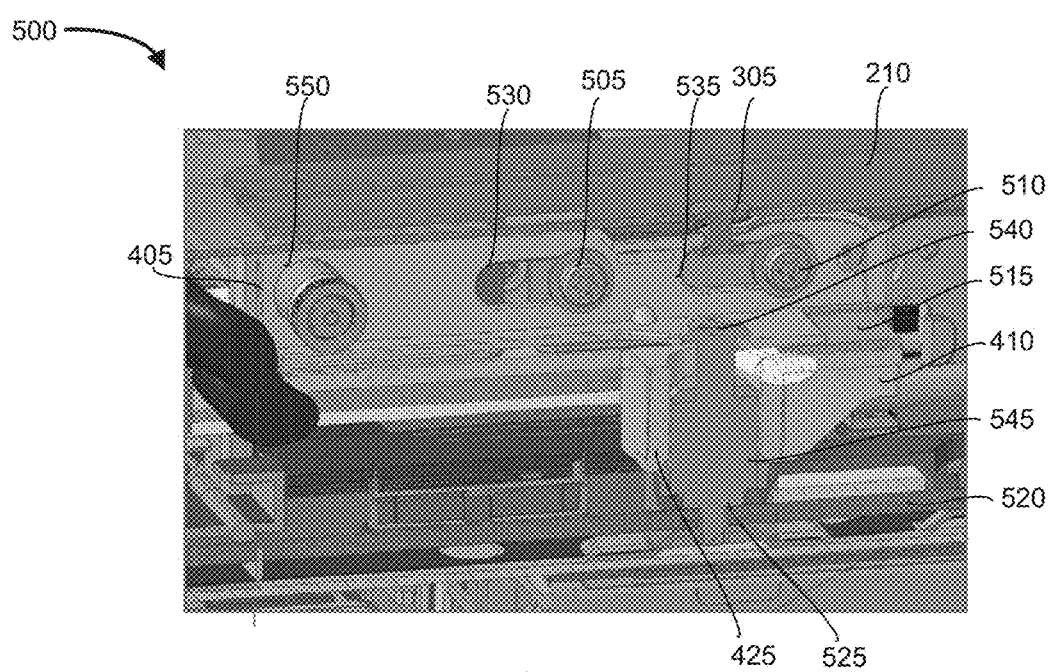
FIG. 5 is a cross-sectional view taken along line A-A in FIG. 4.

FIG. 5 is a cross-sectional view 500 taken along line A-A as shown in FIG. 4. This view shows how sliding bracket 405 may be physically coupled to riser cage 210 via fasteners 505 and 510 through guide slots 530 and 535 respectively, wherein guide slots 530 may be elongated slots or grooves. Sliding bracket 405 may also be secured to riser cage 210 via fastener 550. Examples of fasteners include rivets, screws, machine screws, bolts, nuts, pins, ties, etc. Fasteners 505, 510, and 550 may be mounting screws or similar. In particular, fastener 550 may be a plunger lock or similar. Further, this view shows a physical engagement of connection tab 305 to riser cage 210 and sliding bracket 405. This physical engagement may allow the top cover of the information handling system to be supported, such as when a hoist vacuum is used to carry the information handling system from one location to another. Thus, avoiding the possibility of deforming the top cover, such as top cover 300 of FIG. 3.

This view also shows a physical engagement of riser cage 210 and sliding bracket 405 to a system board 520 via mezzanine card holder 410 and a guiding rail 515, wherein guiding rail 515 is disposed between sliding bracket 405 and mezzanine card holder 410. A standoff 525 of a system board of the information handling system is disposed through an opening of alignment sleeve 425. Standoff 525 may be a T-standoff which includes a head 540 and a base 545. Head 540 may secure system board 520 to sliding bracket 405. Base 545 may be threaded or unthreaded and physically coupled to a motherboard tray of a chassis of the information handling system through system board 520. This allows sliding bracket 405 to be secured to system board 520 and/or the motherboard tray of the chassis of the information handling system.

Figure 6:
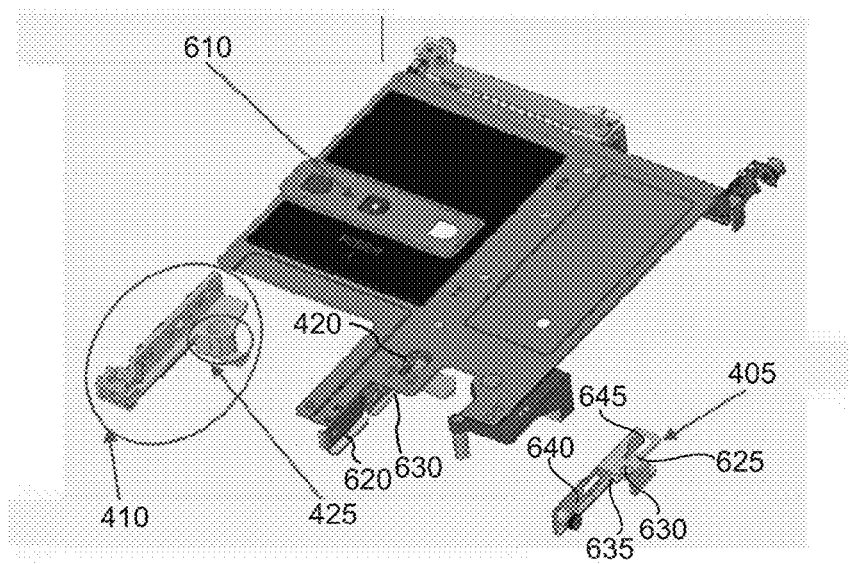
FIG. 6 is a exploded view of a riser cage, according to an embodiment of the present disclosure.

FIG. 6 shows an exploded view of riser cage 210. Riser cage 210 includes a main body 610, sliding bracket 405, and mezzanine card holder 410 with alignment sleeve 425. Main body 610 includes stationary guides 620 and 630 which may be used to secure sliding bracket 405 and mezzanine card holder 410 to main body 610. The stationary guides may also be referred to as connection grooves. Sliding bracket 405 includes surfaces 625, 635, and 640. Surface 625 may be disposed adjacent to one end of surface 640. For example, surfaces 625 and 640 may be positioned at approximately 90 degrees relative to each other. Further, the length of surface 625 may be approximately the same as the length of surface 640. Similarly, surface 635 may be disposed adjacent to another end of surface 640. For example, surfaces 635 and 640 may be positioned at approximately 90 degrees relative to each other. Further, the length of surface 635 may be approximately three-quarters or so of surface 640.

Figure 7:
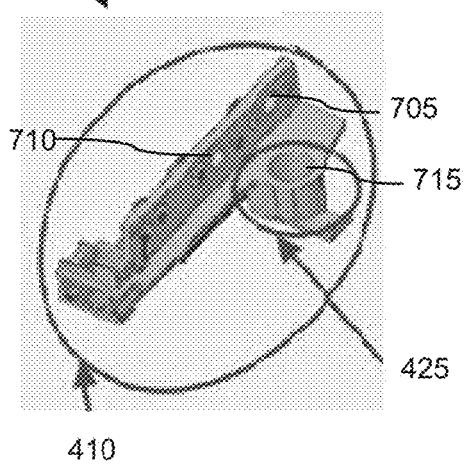
FIG. 7 is a perspective view of a mezzanine card holder, according to an embodiment of the present disclosure.

FIG. 7 shows a perspective view of mezzanine card holder 410 with alignment sleeve 425. Alignment sleeve 425 includes an opening 715 with a diameter that is greater than standoff 525. Mezzanine card holder 410 includes mounting holes, such as mounting holes 705 and 710 which may be used to physically couple mezzanine card holder 410 to riser cage 210 via one or more fasteners.

Figure 8:
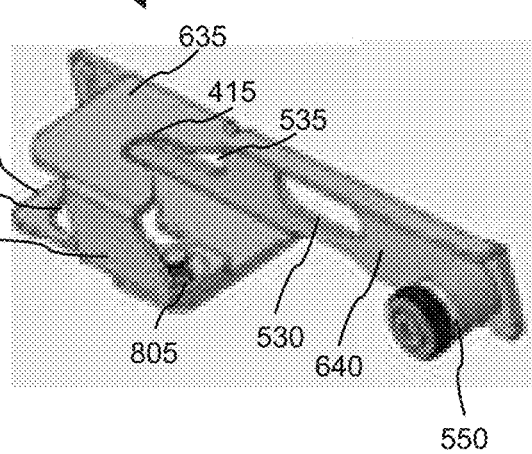
FIG. 8 is a perspective view of a sliding bracket, according to an embodiment of the present disclosure.

FIG. 8 shows a perspective view of sliding bracket 405. Sliding bracket 405 includes surfaces 640, 635, and 625 which are configured with different features. The view includes fastener 550 along one end of surface 640. Surface 640 includes two guide slots 530 and 535 that are next to each other along surface 640. In this example, guide slot 530 may be located around the middle of sliding bracket 405 between fastener 550 and guide slot 535. Surface 640 may also include a slot for fastener 550 to rest into. The guide slots may be used to slide or glide sliding bracket 405 to physically couple with riser cage 210.

Surface 635 includes opening 415 which may be a semi-circular notch, U-shaped slot, or channel at one end of surface 635. The semi-circular notch may be used to interlock with a standoff of the information handling system's system board when sliding bracket 405 is in a locked position. Approximately three-quarters or so of the length of surface 635 is thinner than the remaining length of surface 635. Surface 625 may include connection slot 645. Connection slot 645 may be aligned with connection slot 420 of FIG. 4. Further connection slot 645 may include a semi-circular notch, U-shaped slot, or channel at one section. This notch may align with the notch at surface 635. Surface 625 may also include rivet 805 which may be used to physically couple surfaces 635 and 625, wherein a portion 810 of surface 625 may be folded perpendicularly to meet with an underside of surface 635.

Figure 9:
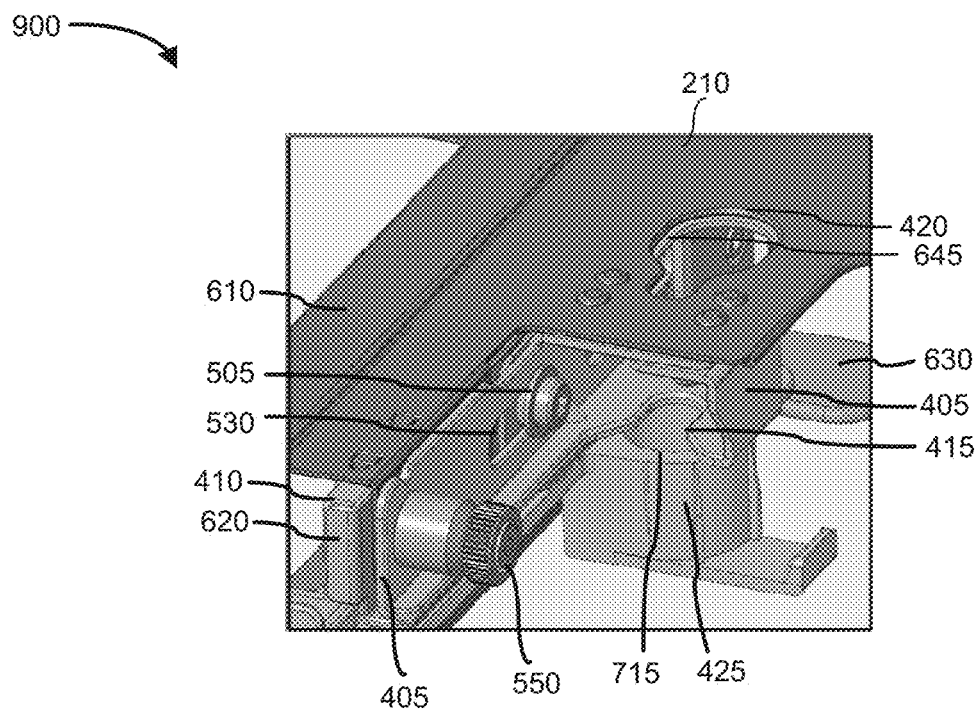
FIG. 9 is a perspective view of a sliding bracket and a mezzanine card holder with a riser cage, according to an embodiment of the present disclosure.

FIG. 9 shows a perspective view 900 of a section of riser cage 210 and sliding bracket 405. Perspective view 900 shows an opening 415 which may be aligned with opening 715 of alignment sleeve 425. Sliding bracket 405 may be configured to engage with stationary guide 620 and 630, such that connection slot 645 is aligned with connection slot 420. Sliding bracket 405 may be secured in place by fasteners 505, 510, and 550.

Figure 10:
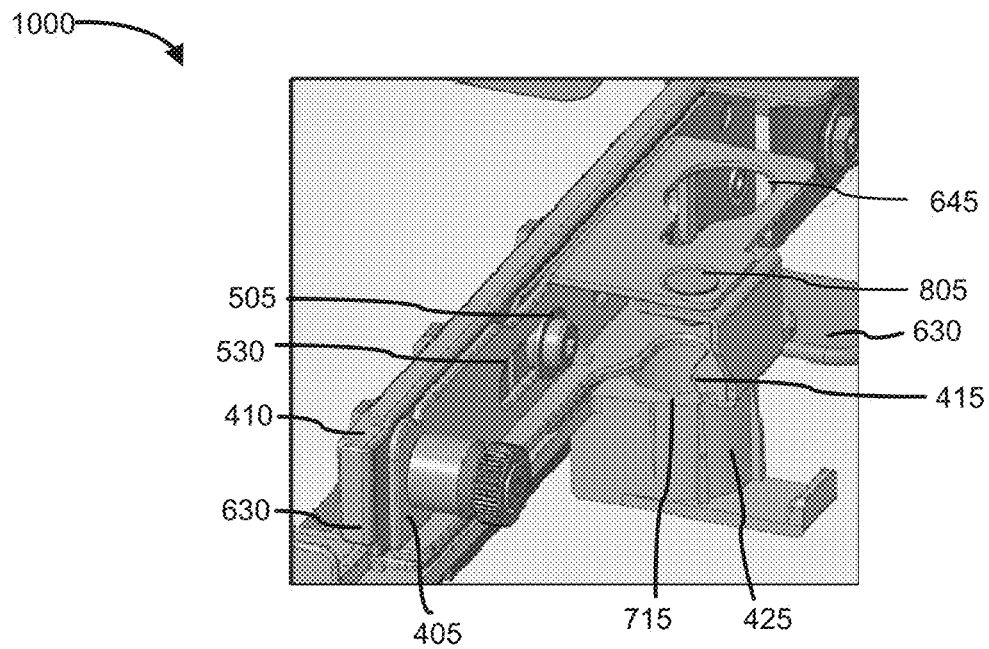
FIG. 10 is a perspective view of a sliding bracket and a mezzanine card holder coupled to a stationary guide associated with a chassis of an information handling system, according to an embodiment of the present disclosure.

FIG. 10 shows a perspective view 1000 which is similar to perspective view 900 of FIG. 9 with main body 610 of riser cage 210 removed to show additional details associated with the present disclosure. For example, perspective view 1000 shows that stationary guide 630 is disposed between sliding bracket 405 and mezzanine card holder 410. Further, perspective view 1000 shows rivet 805 which may be used to physically couple surfaces 635 and 625. Rivet 805 may be located above opening 715 of mezzanine card holder 410. Perspective view 1000 also shows a location of connection slot 645 relative to rivet 805.

Figure 11:
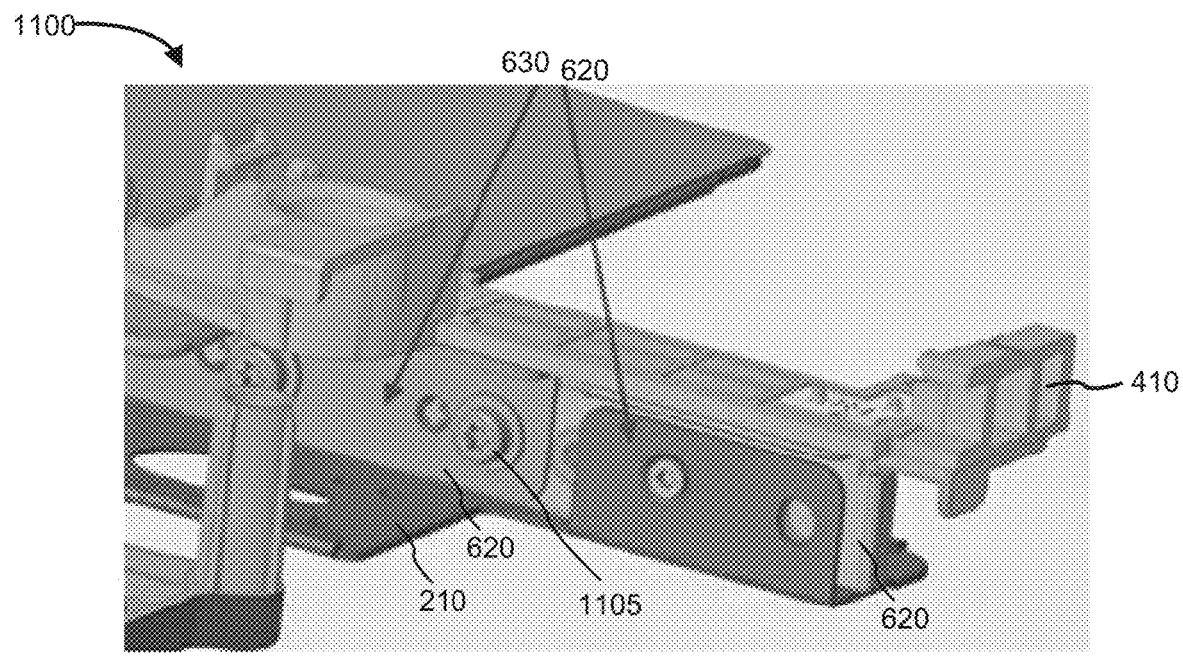
FIG. 11 is a perspective view of a mezzanine card holder and a section of a riser cage, according to an embodiment of the present disclosure.

FIG. 11 shows a perspective view 1100 of mezzanine card holder 410 and a section of riser cage 210. Perspective view 1100 shows mezzanine card holder 410 physically coupled to riser cage 210 via stationary guides 620 and 630 using one or more fasteners, such as fastener 1105.

Figure 12:
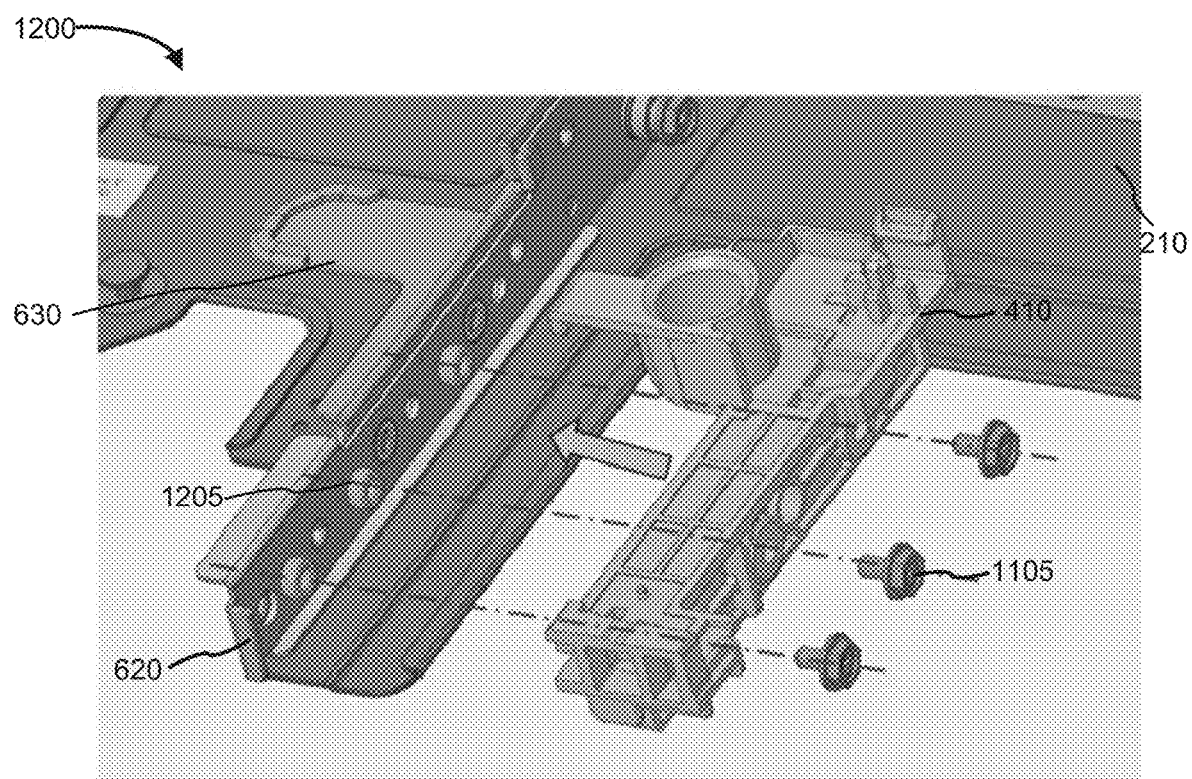
FIG. 12 is a perspective view of a mezzanine card holder and a section of a riser cage, according to an embodiment of the present disclosure.

FIG. 12 shows an exploded view 1200 of mezzanine card holder 410 and a section of riser cage 210. Exploded view 1200 shows how mezzanine card holder 410 may be physically coupled to riser cage 210 via stationary guides 620 and 630. For example, mezzanine card holder 410 may be coupled via one or more fasteners, such as fastener 1105, to one or more mounting holes, such as mounting hole 1205.

Figure 13:
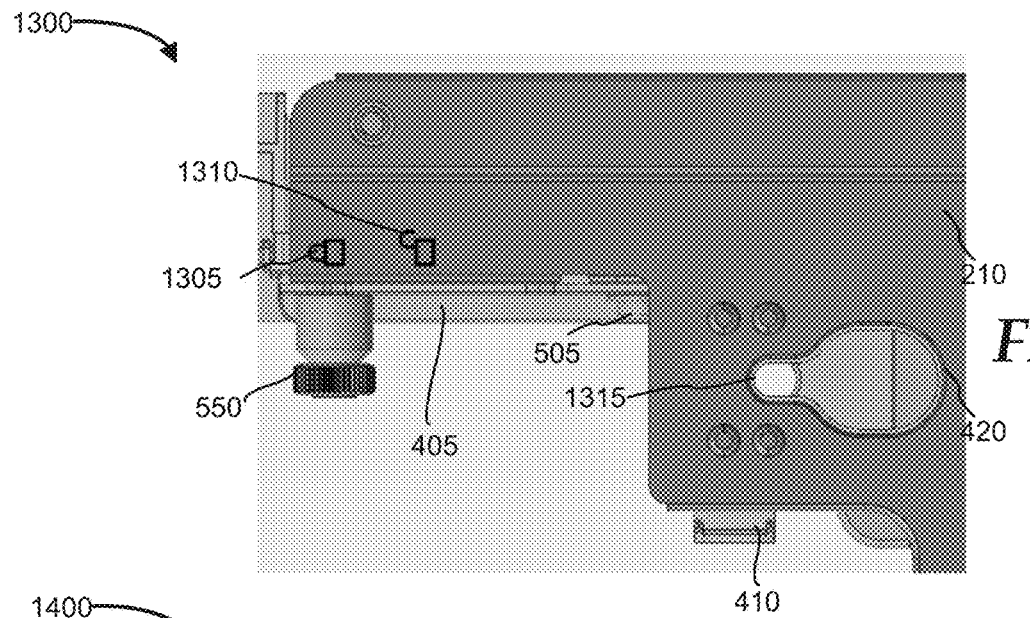
FIG. 13 is a view of a section of a riser cage and a sliding bracket in a locked position, according to an embodiment of the present disclosure.

FIG. 13 shows a perspective view 1300 of sliding bracket 405 and a section of riser cage 210. Perspective view 1300 shows sliding bracket 405 in a locked position 1305. Fastener 550 may be used to move sliding bracket 405 from locked position 1305 to unlocked position 1310 or vice versa. When in locked position 1305, fastener 550 may rest inside a slot and/or rotated into the slot to keep sliding bracket 405 in locked position 1305 and disposed adjacent to a locked marker image. When sliding bracket 405 is in locked position 1305, an opening 1315 may be formed along a channel of connection slot 420, wherein a connection tab associated with the top cover of the information handling system may engage.

Figure 14:
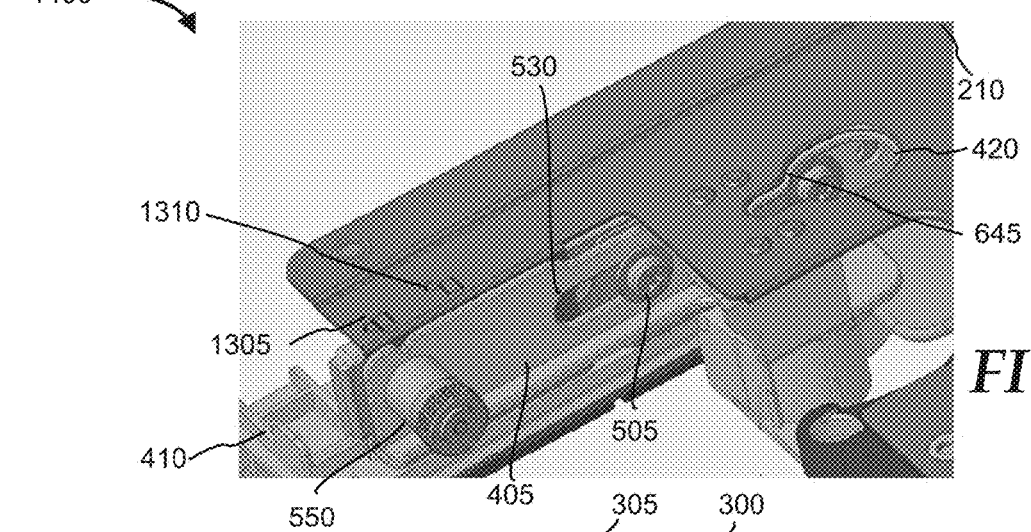
FIG. 14 is a perspective view of a section of a riser cage and a sliding bracket in a locked position, according to an embodiment of the present disclosure.

FIG. 14 shows a perspective view 1400 of sliding bracket 405 and a section or riser cage 210. Perspective view 1400 shows sliding bracket 405 in locked position 1305. When sliding bracket 405 is in locked position 1305, fastener 550 may be positioned towards one end of guide slot 530 away from fastener 550. In addition, when in the locked position, connection slot 420 may be aligned with connection slot 645.

Figure 15:
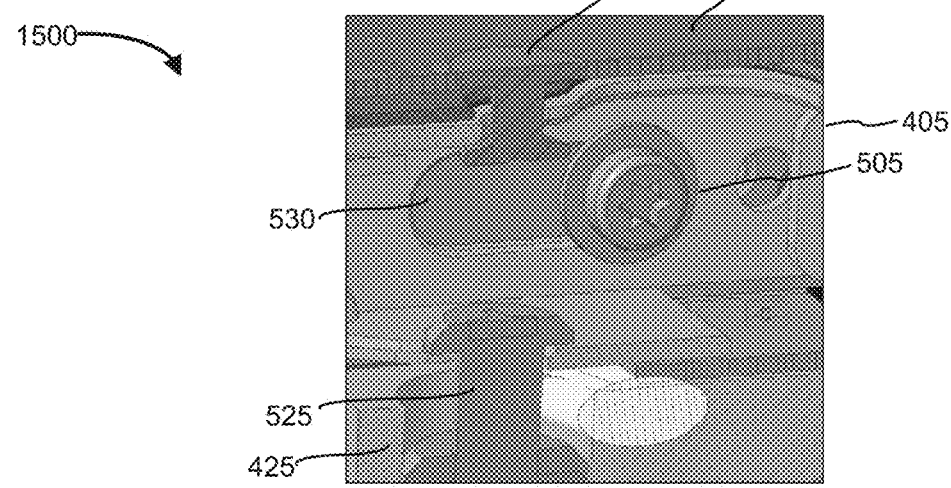
FIG. 15 is a cross-sectional view of a sliding bracket coupled with a connection tab of a top cover and a standoff of a system board of an information handling system, according to an embodiment of the present disclosure.

FIG. 15 shows a cross-section view 1500 of sliding bracket 405 engaged with connection tab 305 of top cover 300. Perspective view 1400 shows how connection tab 305 of top cover 300 may be engaged with connection slot 420 and guide slot 530. Perspective view 1400 also shows a position of connection tab 305 relative to fastener 505.

Figure 16:
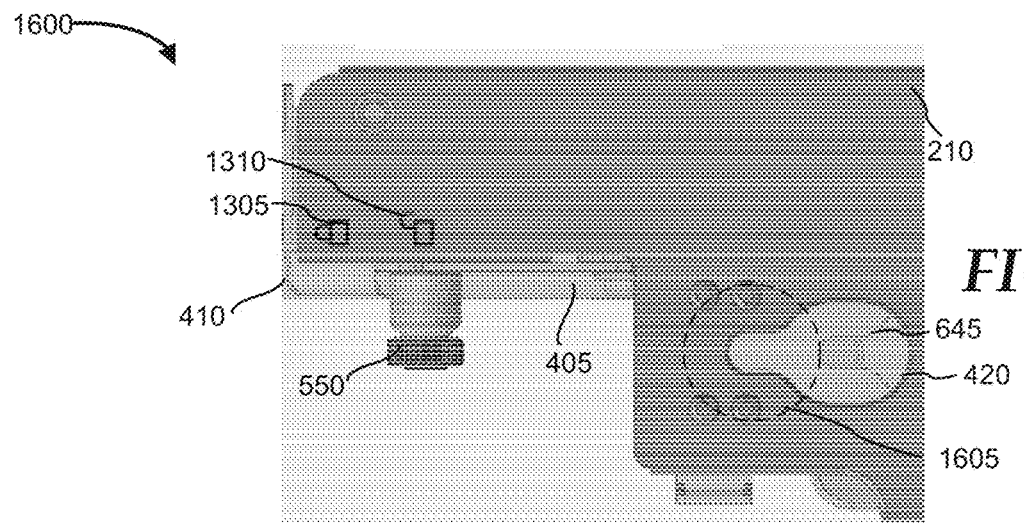
FIG. 16 is a view of a section of a riser cage and a sliding bracket in an unlocked position, according to an embodiment of the present disclosure.

FIG. 16 shows a perspective view 1600 of sliding bracket 405 and a section of riser cage 210. Perspective view 1600 shows sliding bracket 405 in unlocked position 1310. When in unlocked position 1310, fastener 550 may rest outside a slot associated with locked position 1305 and disposed adjacent to an unlock marker image. When sliding bracket 405 is in unlocked position 1310, connection slot 420 may not be aligned with connection slot 645, as such opening 1315 may be closed or not viable as depicted by encircled section 1605.

Figure 17:
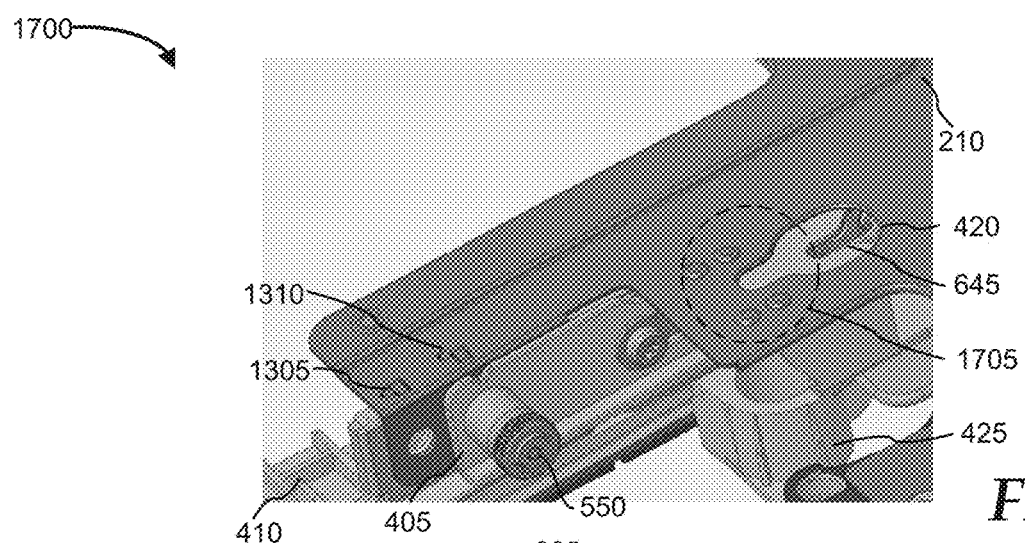
FIG. 17 is a perspective view of a section of a riser cage and a sliding bracket in an unlocked position, according to an embodiment of the present disclosure.

FIG. 17 shows a perspective view 1700 of sliding bracket 405 and a section of riser cage 210. Perspective view 1700 shows sliding bracket 405 in unlocked position 1310. When sliding bracket 405 is in unlocked position 1310, fastener 550 may be positioned towards another end of guide slot 530 towards fastener 550. In addition, when in an unlocked position, connection slot 420 may not be aligned with connection slot 645 as depicted by encircled section 1705.

Figure 18:
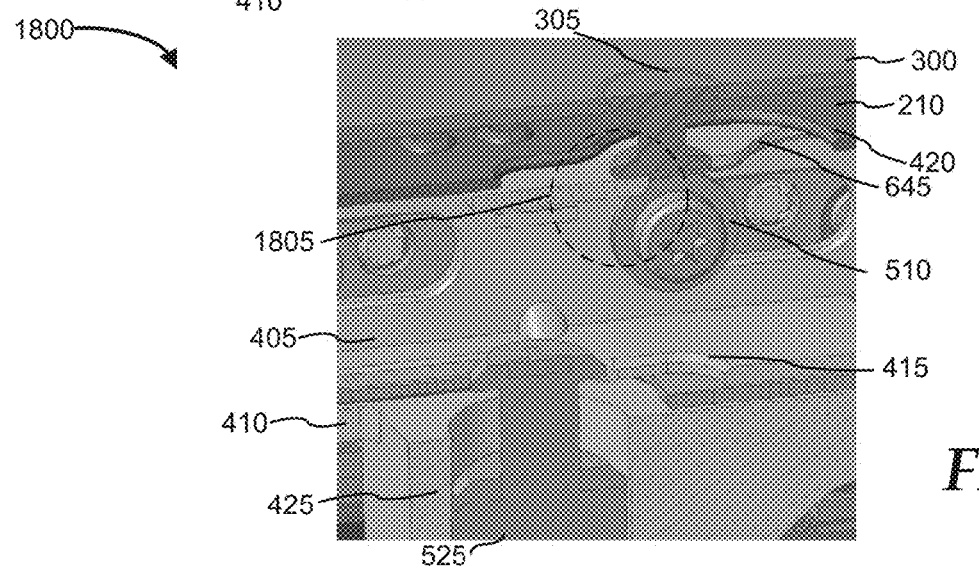
FIG. 18 is a cross-sectional view of a sliding bracket coupled with a connection tab of a top cover and a standoff of a system board of an information handling system, according to an embodiment of the present disclosure.

FIG. 18 shows a cross-section view 1800 of sliding bracket 405 and disengagement of connection tab 305 of top cover 300. An encircled section 1805 of cross-section view 1800 shows how connection tab 305 may hit fastener 510 when a user tries to engage top cover 300 when sliding bracket 405 is in unlocked position 1310. Thus, the top cover support may not be engaged or assembled in place because the connection tab of the top cover may be blocked by a surface of sliding bracket 405.

Those of ordinary skill in the art will appreciate that the configuration and/or hardware components of the top cover support of the information handling system depicted above. For example, the illustrative components are not intended to be exhaustive but rather are representative to highlight components that can be utilized to implement aspects of the present disclosure. For example, other devices and/or components may be used in addition to or in place of the devices/components depicted. The depicted example does not convey or imply any architectural or other limitations with respect to the presently described embodiments and/or the general disclosure. In the discussion of the figures, reference may also be made to components illustrated in other figures for continuity of the description.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded in a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes, or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A support for a top cover of an information handling system, the support comprising:
   a connection tab physically coupled to the top cover of the information handling system;
   a sliding bracket configured to engage with a riser cage of the information handling system and the connection tab of the top cover; and
   a mezzanine card holder with an alignment sleeve through which a standoff of a system board of the information handling system may be inserted, wherein the standoff may engage with the sliding bracket.

2. The support of claim 1, wherein the sliding bracket may slide along a stationary guide of the riser cage.

3. The support of claim 1, wherein the sliding bracket includes a first connection slot used to engage with the connection tab of the top cover, wherein the first connection slot is configured to align with a second connection slot of the riser cage.

4. The support of claim 3, wherein the first connection slot and the second connection slot are aligned when the sliding bracket is in a locked position.

5. The support of claim 3, wherein the first connection slot and the second connection slot are not aligned when the sliding bracket is in an unlocked position.

6. The support of claim 1, wherein the sliding bracket includes a channel configured to align with the alignment sleeve.

7. The support of claim 1, wherein the sliding bracket includes a plunger lock which is configured to engage the sliding bracket in a locked position.

8. The support of claim 1, wherein the standoff is further physically coupled to a support tray of the system board.

9. The support of claim 1, wherein the mezzanine card holder is mounted to the riser cage.

10. An information handling system, comprising:
   a connection tab physically coupled to a top cover of the information handling system;
   a sliding bracket configured to engage with a riser cage of the information handling system and the connection tab of the top cover; and
   a mezzanine card holder with an alignment sleeve through which a standoff of a system board of the information handling system may be inserted, wherein the standoff may engage with the sliding bracket.

11. The information handling system of claim 10, wherein the sliding bracket may slide along a stationary guide of the riser cage.

12. The information handling system of claim 10, wherein the sliding bracket includes a first connection slot used to engage with the connection tab of the top cover, wherein the first connection slot is configured to align with a second connection slot of the riser cage.

13. The information handling system of claim 12, wherein the first connection slot and the second connection slot are aligned when the sliding bracket is in a locked position.

14. The information handling system of claim 12, wherein the first connection slot and the second connection slot are not aligned when the sliding bracket is in an unlocked position.

15. The information handling system of claim 10, wherein the sliding bracket includes a channel configured to align with the alignment sleeve.

16. An information handling system comprising:
   a connection tab physically coupled to a top cover of the information handling system;
   a sliding bracket configured to engage with a riser cage via a stationary guide of the riser cage, the sliding bracket further configured to engage the connection tab of the top cover; and
   a mezzanine card holder mounted to the riser cage, wherein the mezzanine card holder includes an alignment sleeve through which a standoff of a system board of the information handling system may be inserted.

17. The information handling system of claim 16, wherein the standoff is further physically coupled to a support tray of the system board.

18. The information handling system of claim 16, wherein the sliding bracket includes a first connection slot used to engage with the connection tab of the top cover, wherein the first connection slot is configured to align with a second connection slot of the riser cage.

19. The information handling system of claim 18, wherein the first connection slot and the second connection slot are aligned when the sliding bracket is in a locked position.

20. The information handling system of claim 18, wherein the first connection slot and the second connection slot are not aligned when the sliding bracket is in an unlocked position.

* * * * *